(12) United States Patent
Kuo et al.

(10) Patent No.: US 12,068,400 B2
(45) Date of Patent: Aug. 20, 2024

(54) BIPOLAR JUNCTION TRANSISTORS AND METHODS OF FORMING THE SAME

(71) Applicant: TAIWAN SEMICONDUCTOR MANUFACTURING COMPANY, LTD., Hsinchu (TW)

(72) Inventors: Chun-Tsung Kuo, Tainan (TW); Chuan-Feng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 6 days.

(21) Appl. No.: 17/737,003

(22) Filed: May 4, 2022

(65) Prior Publication Data

US 2023/0361204 A1    Nov. 9, 2023

(51) Int. Cl.
*H01L 29/732* (2006.01)
*H01L 29/08* (2006.01)
*H01L 29/10* (2006.01)
*H01L 29/66* (2006.01)

(52) U.S. Cl.
CPC ........ *H01L 29/732* (2013.01); *H01L 29/0817* (2013.01); *H01L 29/0821* (2013.01); *H01L 29/1004* (2013.01); *H01L 29/66272* (2013.01)

(58) Field of Classification Search
CPC ............... H01L 29/732; H01L 29/0817; H01L 29/0821; H01L 29/1004; H01L 29/66272; H01L 29/0649; H01L 29/66242
See application file for complete search history.

(56) References Cited

U.S. PATENT DOCUMENTS

| | | | | |
|---|---|---|---|---|
| 9,786,770 B1 * | 10/2017 | John | ............... | H01L 29/735 |
| 11,183,587 B2 | 11/2021 | Kuo et al. | | |
| 2003/0178700 A1 * | 9/2003 | Franosch | ............ | H01L 29/1004 |
| | | | | 257/565 |
| 2017/0236923 A1 * | 8/2017 | Chevalier | ........... | H01L 29/0804 |
| | | | | 257/578 |
| 2021/0134988 A1 * | 5/2021 | Kuo | ................... | H01L 29/7371 |

* cited by examiner

*Primary Examiner* — Syed I Gheyas
(74) *Attorney, Agent, or Firm* — NZ CARR LAW OFFICE

(57) ABSTRACT

A BJT and methods of forming the same are described. The BJT includes a collector region disposed in a substrate, a lower base structure disposed on the collector region, a first dielectric layer surrounding a bottom portion of the lower base structure, and a second dielectric layer surrounding a top portion of the lower base structure. The first dielectric layer includes a first oxide, the second dielectric layer includes a second oxide, and the first and second oxides have different densities. The BJT further includes an upper base structure disposed on the second dielectric layer and the lower base structure, an emitter region disposed on the lower base structure, a sidewall spacer structure disposed between the emitter region and the upper base structure, and the sidewall spacer structure includes a material different from materials of the first and second dielectric layers.

20 Claims, 14 Drawing Sheets

BIPOLAR JUNCTION TRANSISTORS AND METHODS OF FORMING THE SAME

BACKGROUND

Bipolar junction transistors (BJTs) are commonly used in digital and analog integrated circuit (IC) devices for high frequency applications. A BJT includes two p-n junctions sharing a cathode or anode region called a base. The base separates two regions respectively called an emitter and a collector. The emitter and the collector have the same doping type as each other and have an opposite doping type as the base. Depending on the doping types of the base, collector, and emitter, a BJT may be an NPN BJT or a PNP BJT.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
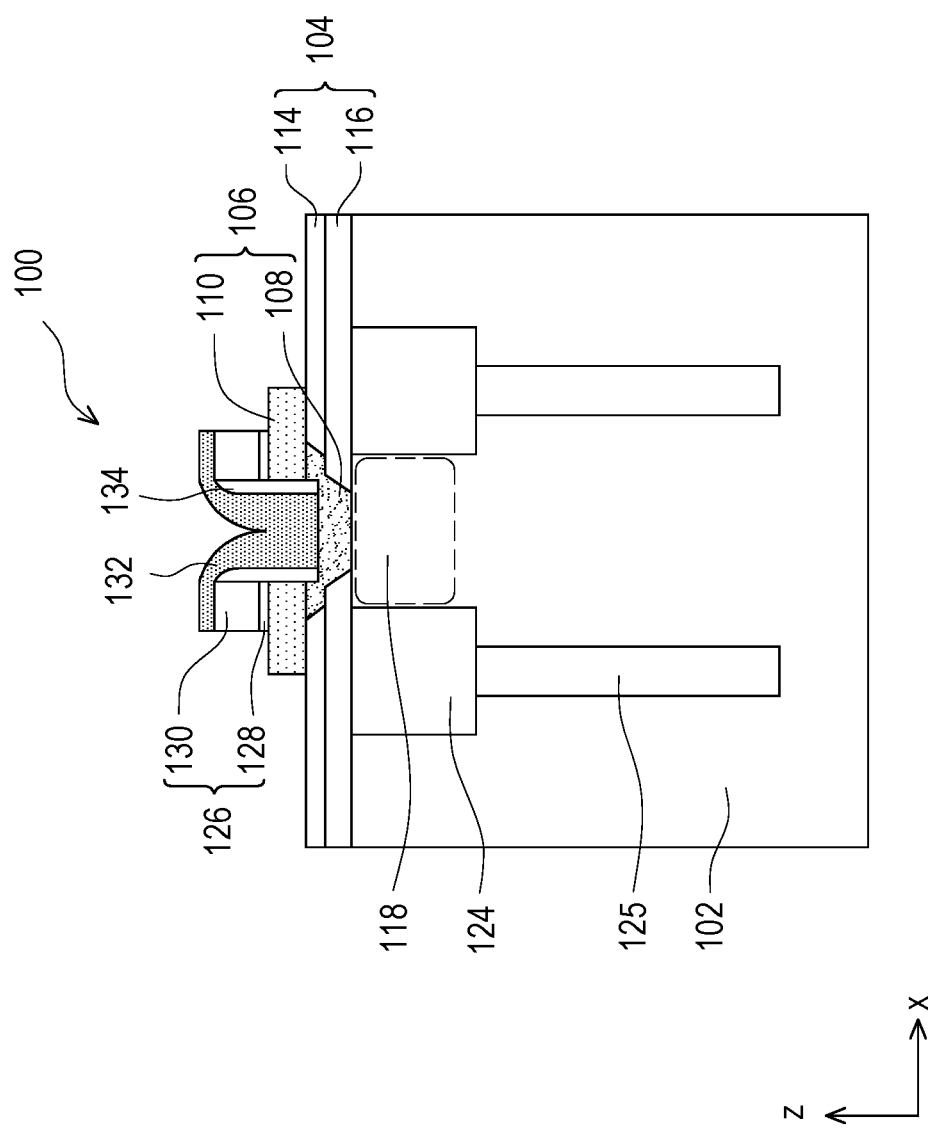
FIG. 1A is a cross-sectional side view of a bipolar junction transistor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Some methods for forming a bipolar junction transistor (BJT) includes: depositing an oxide layer over a substrate; depositing a base polysilicon layer over the oxide layer; patterning the base polysilicon layer to form an opening exposing the oxide layer and overlying a doped region in the substrate that forms a collector; forming a sidewall spacer structure on a sidewall of the base polysilicon layer in the opening; performing an etch vertically and laterally into the oxide layer through the opening to extend the opening to the collector and to extend the opening under the base polysilicon layer; depositing a silicon germanium base at a bottom of the opening; depositing an emitter poly silicon layer filling a remainder of the opening over the silicon germanium base; and patterning the base polysilicon layer and the base emitter layer to respectively form a polysilicon base and an emitter. The polysilicon base and the silicon germanium base directly contact and collectively form a base.

A challenge with the method is that a contact area between the polysilicon base and the silicon germanium base is small and hence a contact resistance between the polysilicon base and the silicon germanium base is high. The contact resistance partially increases overall resistance of the base. For example, the resistance of the base (Rb) may be proportional to or positively correlative to the contact resistance, the resistance of the polysilicon base, and the resistance of the silicon germanium base. Hence, the resistance of the base is also high. The high base resistance leads to low current and hence high transit time. The high transit time may reduce the transition frequency (Ft), the maximum oscillation frequency (Fmax), and hence performance of the BJT. The maximum oscillation frequency may, for example, be the frequency at which power gain is one (unity). The transition frequency may, for example, be the frequency at which short-circuit current gain is one (unity).

Various embodiments of the present disclosure are directed towards a method for forming a BJT including a bilayer base dielectric film, as well as the BJT resulting from the method. In some embodiments, the bilayer base dielectric film include oxide layers formed by different processes, thus the oxide layers have different etch selectivity. More of the top oxide may be removed by an etch process, leading to increased contact area between a lower base structure formed in the opening in the oxide layers and an upper base structure. Because the contact area is increased, the contact resistance between the lower and upper base structures (e.g., a resistance at the contact area) may be small. As such, an overall resistance of a base collectively formed by the lower and upper base structures may be small. Because the resistance of the base may be small, current through the BJT may be large and hence the transit time of the BJT may be small. Because of the large current and the small transit time, the transition frequency of the BJT and the maximum oscillation frequency of the BJT may be large. Furthermore, the cut-off frequency may be raised due to the small transit time of the BJT. The contact area may be enlarged at relatively low complexity and at relatively low cost as a result of the bilayer base dielectric film.

FIG. 1A is a cross-sectional side view of a BJT 100, in accordance with some embodiments. As shown in FIG. 1A, the BJT 100 is disposed over a substrate 102. The substrate 102 may be a semiconductor substrate. In some embodiments, the substrate 102 is a bulk semiconductor substrate, a semiconductor-on-insulator (SOI) substrate, or other suitable type of substrate. The substrate 102 includes monocrystalline silicon or other suitable semiconductor material. In some embodiments, an upper portion of the substrate 102 may be doped and is a collector region 118. The collector region 118 may be doped with a p-type dopant or an n-type dopant. The collector region 118 is surrounded by an isolation region 124. The isolation region 124 includes a dielectric material, such as silicon oxide or other suitable dielectric material. In some embodiments, the isolation region 124 is a shallow trench isolation (STI), a deep trench isolation (DTI), or other suitable isolation. In some embodiments, as shown in FIG. 1A, another isolation region 125 is disposed below the isolation region 124. The isolation region 125 may be a DTI.

A base dielectric film 104 is disposed on the substrate 102. The base dielectric film 104 includes a bottom dielectric layer 116 and a top dielectric layer 114 disposed on the bottom dielectric layer 116. In some embodiments, the top dielectric layer 114 and the bottom dielectric layer 116 includes oxides formed by different processes. For example, the bottom dielectric layer 116 may include silicon oxide formed by a thermal process, and the top dielectric layer 114 may include silicon oxide formed by a process at a processing temperature below the processing temperature of the thermal process. In some embodiments, the top dielectric layer 114 is formed by a chemical vapor deposition (CVD) process using tetraethyl orthosilicate (TEOS) as a precursor. Even though both the top dielectric layer 114 and the bottom dielectric layer 116 include silicon oxide, the different processes used to form the silicon oxide lead to different etch selectivity in an etch process. For example, oxide layers, such as silicon oxide layers, formed at different processing temperatures can have different material properties, such as density, crystal size, and/or crystal density, which lead to different etch rates in an etch process. In some embodiments, the oxide layer formed at a higher temperature has smaller and more dense crystals, while the oxide layer formed at a lower temperature has larger and less dense crystals. The oxide layer formed at a higher temperature may also have a higher layer density compared to the oxide layer formed at a lower temperature. The oxide layer formed at a higher temperature has a slower etch rate compared to the oxide layer formed at a lower temperature. As a result, more material from the top dielectric layers 114 is removed than from the bottom dielectric layer 116 during an etch process, because the bottom dielectric layer 116 is formed at a higher processing temperature than that of the top dielectric layer 114. Alternatively or in addition to using different processing temperatures to form oxide layers having different etch rates, different processes may be used. For example, the bottom dielectric layer 116 is formed by oxidation of the substrate 102, while the top dielectric layer 114 is formed by a deposition process, such as CVD. The density and/or crystal density of the bottom dielectric layer 116 formed by oxidation of the substrate 102 may be substantially higher than those of the top dielectric layer 114 formed by a deposition process.

In some embodiments, the top dielectric layer 114 and the bottom dielectric layer 116 are nitrogen-free. The top dielectric layer 114 has a first thickness in the z-direction, and the bottom dielectric layer 116 has a second thickness in the z-direction. In some embodiments, the second thickness is substantially greater than the first thickness. For example, the second thickness may range from about 15 nm to about 25 nm, and the first thickness may range from about 10 nm to about 20 nm.

As shown in FIG. 1A, a lower base structure 108 is disposed in the top and bottom dielectric layers 114, 116. The lower base structure 108 includes a semiconductor material. In some embodiments, the lower base structure 108 includes doped germanium, doped silicon germanium, or other suitable semiconductor material. The dopant of the lower base structure 108 may be p-type dopant or n-type dopant. In some embodiments, the dopant of the lower base structure 108 and the dopant of the collector region 118 have opposite dopant type. For example, the collector region 118 is doped with a p-type dopant, and the lower base structure 108 is doped with an n-type dopant. Furthermore, the semiconductor materials of the collector region 118 and the lower base structure 108 have different bandgaps. For example, the collector region 118 includes doped monocrystalline silicon, and the lower base structure 108 includes doped silicon germanium.

An upper base structure 110 is disposed on the lower base structure 108 and the base dielectric film 104. Collectively, the lower base structure 108 and the upper base structure 110 form a base region 106. The upper base structure 110 is in direct contact with the lower base structure 108. As illustrated and explained in detail hereafter, the portion of the lower base structure 108 in contact with the upper base structure 110 may be large because of the bottom and top dielectric layers 116, 114. The portion of the lower base structure 108 in contact with the upper base structure 110 or the portion of the upper base structure 110 in contact with the lower base structure 108 may be referred to as the contact area between the lower base structure 108 and the upper base structure 110. The upper base structure 110 includes a doped semiconductor material having a different bandgap than the semiconductor material of the lower base structure 108, and the upper base structure 110 and the lower base structure 108 may share a common dopant type (e.g., p-type or n-type). For example, the upper base structure 110 includes doped polycrystalline silicon, doped silicon, or other suitable semiconductor material. In some embodiments, the lower base structure 108 includes doped silicon germanium with an n-type dopant, and the upper base structure 110 includes doped polysilicon with an n-type dopant.

A hard mask 126 is disposed on the upper base structure 110 and includes a first hard mask layer 128 and a second hard mask layer 130 disposed on the first hard mask layer 128. The number of the hard mask layers is not limited to two. The first and second hard mask layers 128, 130 include different dielectric materials. For example, the first hard mask layer 128 includes an oxide, such as silicon oxide, and the second hard mask layer 130 includes a nitride, such as silicon nitride. In some embodiments, the hard mask 126 has a width in the x-direction substantially less than a width of the upper base structure 110, as shown in FIG. 1A.

An emitter region 132 is disposed on the hard mask 126 and extends downward through the hard mask 126 and the upper base structure 110 to direct contact with the lower base structure 108. The emitter region 132 includes a doped semiconductor material having an opposite doping type as the base region 106 and/or the same doping type as the collector region 118. For example, the emitter region 132 may include a p-type dopant, whereas the base region 106 may include an n-type dopant, or vice versa. Further, the emitter region 132 has a bandgap that is different than that of the lower base structure 108. As such, the emitter region 132 and the lower base structure 108 may form a heterojunction at an interface at which the emitter region 132 and the lower base structure 108 directly contact. In some embodiments, the emitter region 132 has a higher bandgap than the lower base structure 108. Further, in some embodiments, the emitter region 132 has the same bandgap as the upper base structure 110. The emitter region 132 may, for example, include doped polycrystalline silicon or other suitable semiconductor material.

In some embodiments, the emitter region 132 and the upper base structure 110 include the same semiconductor material. For example, the emitter region 132 and the upper base structure 110 may both include doped polysilicon. In some embodiments, the emitter region 132 and the collector region 118 share a common semiconductor element. For example, the emitter region 132 may include polycrystalline silicon, whereas the collector region 118 may include monocrystalline silicon. In some embodiments, the emitter region 132 and the collector region 118 respectively have a polycrystalline lattice and monocrystalline lattice. In some embodiments, the collector region 118 includes monocrystalline silicon doped with a p-type dopant, the lower base structure 108 includes silicon germanium doped with an n-type dopant, the upper base structure 110 includes polycrystalline silicon doped with an n-type dopant, and the emitter region 132 includes polycrystalline silicon doped with a p-type dopant. The BJT 100 may be a PNP-type BJT or an NPN-type BJT.

As described above, because the contact area between the lower base structure 108 and the upper base structure 110 is large, the contact resistance between the lower and upper base structures 108, 110 (e.g., a resistance at the contact area) may be small. As such, an overall resistance of the base region 106 may be small. Because the resistance of the base region 106 may be small, current through the BJT 100 may be large and hence the transit time of the BJT 100 may be small. Because of the large current and the small transit time, the transition frequency (Ft) and the maximum oscillation frequency (Fmax) may be high. For example, when the BJT 100 is an NPN-type BJT, the transition frequency may be greater than about 240 gigahertz (GHz) or some other suitable value and/or the maximum oscillation frequency may be greater than about 400 GHz or some other suitable value. As another example, when the BJT 100 is an PNP-type BJT, the transition frequency may be greater than about 100 GHz or other suitable value and/or the maximum oscillation frequency may be greater than about 160 GHz or some other suitable value. The maximum oscillation frequency may, for example, be the frequency at which power gain is one (unity). The transition frequency may, for example, be the frequency at which short-circuit current gain is one (unity). The BJT 100 may, for example, be a heterojunction BJT (HBT) or some other suitable type of BJT. Applications of the BJT 100 may, for example, include space-based radar, automation radar, and high-speed short-range wireless communication. Other suitable applications are, however amenable.

As shown in FIG. 1A, a sidewall spacer structure 134 laterally separates the emitter region 132 from the hard mask 126 and the upper base structure 110. The sidewall spacer structure 134 may include dielectric material, such as silicon nitride or other suitable dielectric material. In some embodiments, the sidewall spacer structure 134 includes the same dielectric material as the second hard mask layer 130. The sidewall spacer structure 134 include a material different from the materials of the bottom and top dielectric layers 116, 114. The bottoms of the sidewall spacer structure 134 and the emitter region 132 are located at a level below the top surface of the top dielectric layer 114, as shown in FIG. 1A.

Figure 1B:
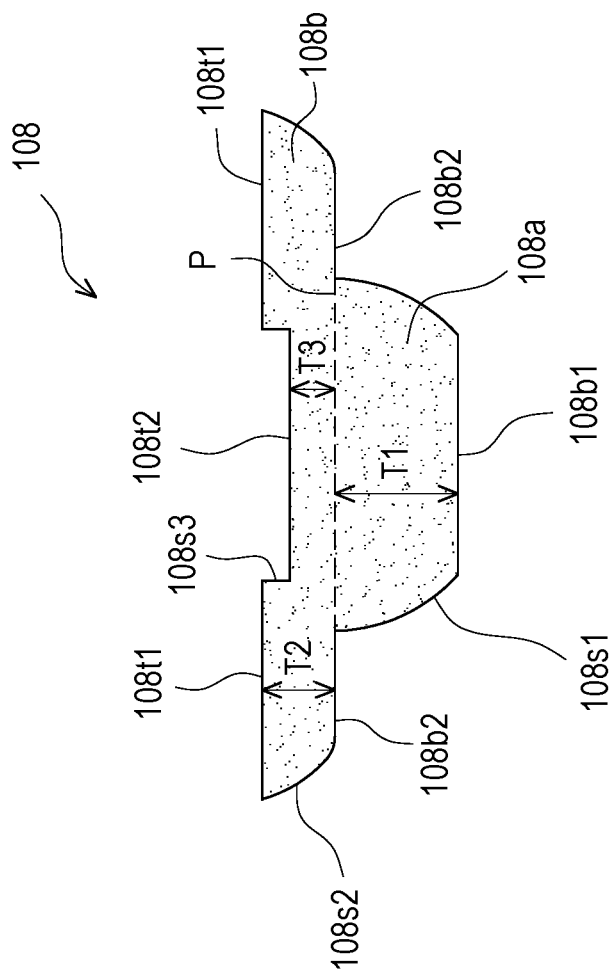
FIG. 1B is a cross-sectional side view of a lower base structure of the bipolar junction transistor of FIG. 1A, in accordance with some embodiments.

FIG. 1B is a cross-sectional side view of the lower base structure 108 of the BJT 100 of FIG. 1A, in accordance with some embodiments. As shown in FIG. 1B, the lower base structure 108 includes a bottom portion 108a and a top portion 108b extending upward from the bottom portion 108a. The bottom portion 108a and the top portion 108b are formed by an imaginary plane P. The bottom portion 108a and the top portion 108b are monolithic. The bottom portion 108a has a thickness T1, and the top portion 108b has different thicknesses T2 and T3. An outer portion of the top portion 108b includes the thickness T2, and an inner portion of the top portion 108b includes the thickness T3. In some embodiments, the thickness T1 is substantially greater than the thicknesses T2 or T3. The thickness T1 may be the same as the thickness of the bottom dielectric layer 116, and the thickness T2 may be the same as the thickness of the top dielectric layer 114. The thickness T3 is substantially less than the thickness T2. In some embodiments, the bottom portion 108a is surrounded by the bottom dielectric layer 116, and the top portion 108b is surrounded by the top dielectric layer 114.

As shown in FIG. 1B, the lower base structure 108 includes a first bottom surface 108b1, a first side surface 108s1 connected to and extending upwards from the first bottom surface 108b1, a second bottom surface 108b2 connected to and extending outwards (or radially) from the first side surface 108s1, a second side surface 108s2 connected to and extending upwards from the second bottom surface 108b2, a first top surface 108t1 connected to and extending inwards from the second side surface 108s2, a third side surface 108s3 connected to and extending downwards from the first top surface 108t1, and a second top surface 108t2 connected to the third side surface 108s3. The side surfaces 108s1, 108s2 may be curved as a result of the etch process that removes portions of the bottom dielectric layer 116 and the top dielectric layer 114, respectively. In some embodiments, the side surfaces 108s1, 108s2 may be substantially flat. The first top surface 108t1 is in direct contact with the upper base structure 110 (FIG. 1A) and may form the contact area between the lower base structure 108 and the upper base structure 110. The third side surface 108s3 surrounds a bottom portion of the sidewall spacer structure 134 (FIG. 1A). The second top surface 108t2 is recessed from the first top surface 108t1 and is in contact with the sidewall spacer structure 134 and the emitter region 132 (FIG. 1A). The bottoms of the sidewall spacer structure 134 and the emitter region 132 are located at a level below the first top surface 108t1.

Figure 2B:
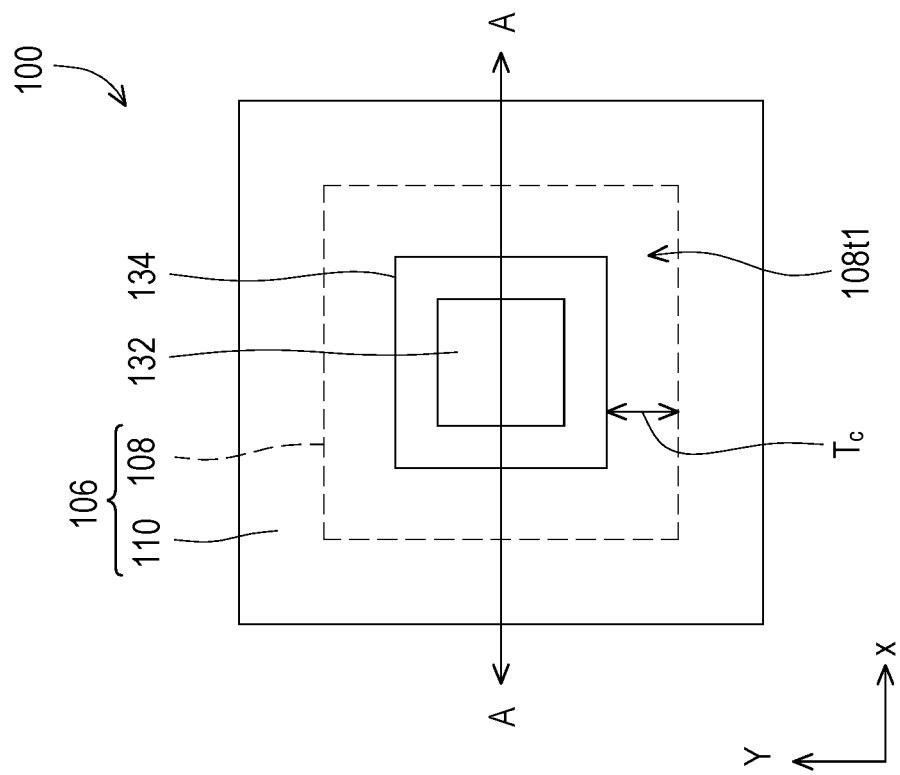
FIGS. 2A and 2B are top views of the bipolar junction transistor of FIG. 1A, in accordance with some embodiments.
Figure 2A:
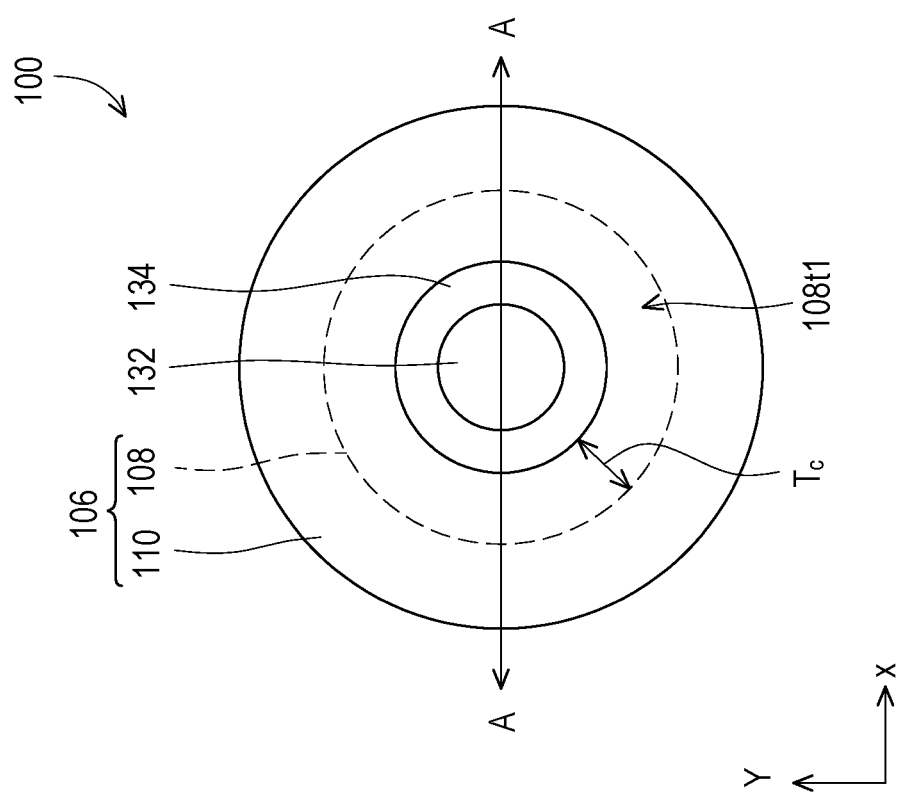

FIGS. 2A and 2B are top views of the BJT 100 of FIG. 1A, in accordance with some embodiments. The cross-sectional view of FIG. 1A may, for example, be taken along cross-section A-A in any of FIGS. 2A and 2B. As shown in FIGS. 2A and 2B, the sidewall spacer structure 134 extends in a first closed path to surround the emitter region 132, and the upper base structure 110 extends in a second closed path to surround the sidewall spacer structure 134. As shown in FIG. 2A, the sidewall spacer structure 134 and the upper base structure 110 are annular shaped. As shown in FIG. 2B, the sidewall spacer structure 134 and the upper base structure 110 are square ring shaped. In other embodiments, other suitable shapes are amenable.

An outer boundary of the lower base structure 108 is shown in phantom, and the first top surface 108t1 of the lower base structure 108 is between the outer boundary of the lower base structure 108 and the sidewall spacer structure 134. In FIG. 2A, the outer boundary of the lower base structure 108 is circular, such that the first top surface 108t1 is annular shaped. In FIG. 2B, the outer boundary of the lower base structure 108 is square, such that the first top surface 108t1 is square ring shaped. In other embodiments, other suitable shapes are amenable.

In some embodiments, a dimension Tc of the first top surface 108t1 ranges from about 10 nm to about 50 nm, such as from about 10 nm to about 30 nanometers, from about 30 nm to about 50 nanometers, or some other suitable range. If the dimension Tc is too small (e.g., less than about 10 nm or some other suitable value), the first top surface 108t1 may be small and hence a contact resistance between the lower base structure 108 and the upper base structure 110 may be high. As a result, an overall resistance of the base region 106 may be high and hence performance of the BJT 100 may be poor. For example, the transition frequency and/or the maximum oscillation frequency may be low. In some embodiments, if the dimension Tc is too large (e.g., greater than about 50 nm or some other suitable value), a semiconductor layer from which the upper base structure 110 is formed may collapse into an opening within which the lower base structure 108 is formed.

Figure 3A:
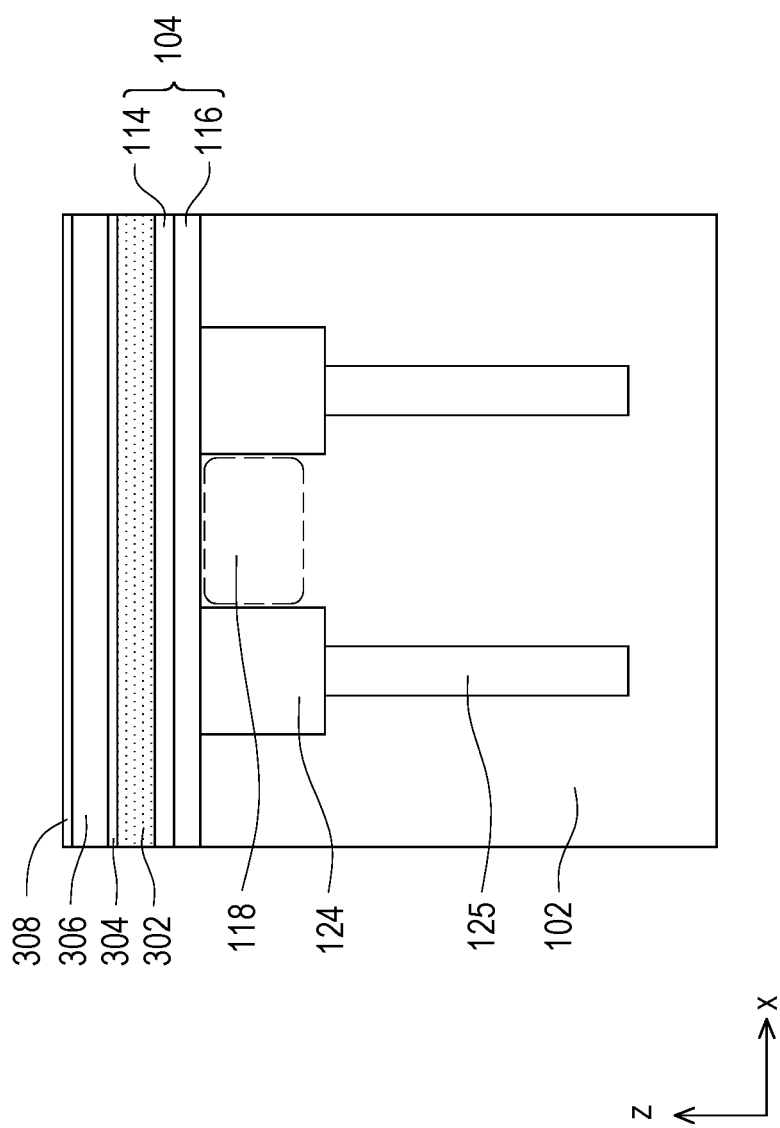
FIGS. 3A-3E are cross-sectional side views of various stages of manufacturing the bipolar junction transistor of FIG. 1A, in accordance with some embodiments.

FIGS. 3A to 3E are cross-sectional side views of various stages of manufacturing the BJT 100 of FIG. 1A, in accordance with some embodiments. As shown in FIG. 3A, the collector region 118 and the isolation regions 124, 125 are formed in the substrate 102, and the base dielectric film 104 is formed on the substrate 102. The base dielectric film 104 is a bilayer structure including the bottom dielectric layer 116 and the top dielectric layer 114. A semiconductor layer 302 is formed on the top dielectric layer 114, a first dielectric layer 304 is formed on the semiconductor layer 302, a second dielectric layer 306 is formed on the first dielectric layer 304, and a third dielectric layer 308 is formed on the second dielectric layer 306. As described above, the top dielectric layer 114 and the bottom dielectric layer 116 are formed by different processes. For example, the bottom dielectric layer 116 includes silicon oxide and is formed by a thermal oxidation process, and the top dielectric layer 114 includes silicon oxide and is formed by a CVD process using TEOS as a precursor. The CVD process is performed at a lower processing temperature than that of the thermal process. Furthermore, there is no annealing process after depositing the top dielectric layer 114 on the bottom dielectric layer 116. The annealing process exposes both the top and bottom dielectric layers 114, 116 to the same high temperature, and the top and bottom dielectric layers 114, 116 may not have different etch rates as a result. The semiconductor layer 302 may include the same material as the upper base structure 110 and may be formed by any suitable method, such as chemical vapor deposition (CVD). The first dielectric layer 304 may include the same material as the first hard mask layer 128 and may be formed by any suitable method, such as CVD or atomic layer deposition (ALD). The second dielectric layer 306 may include the same material as the second hard mask layer 130 and may be formed by any suitable method, such as CVD or ALD. The third dielectric layer 308 may include the same material as the first dielectric layer 304 and may be formed by any suitable method, such as CVD or ALD.

Figure 3B:
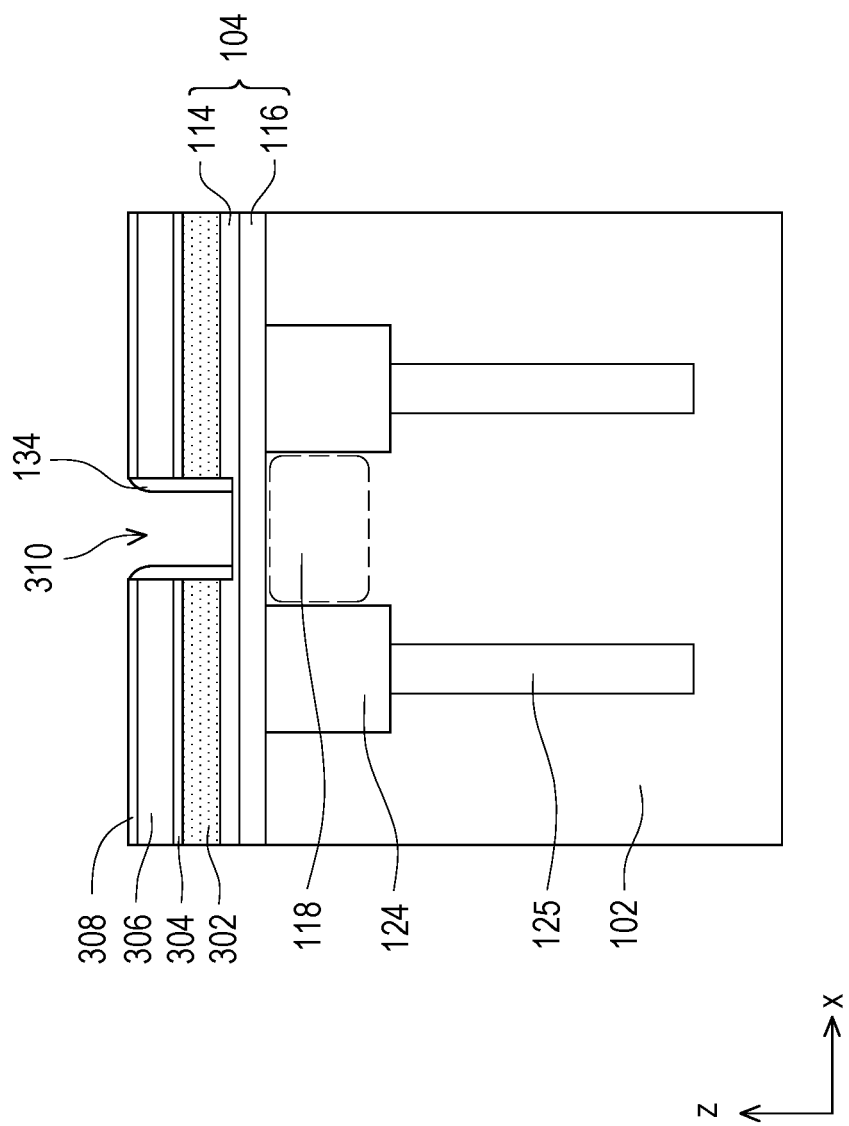

As shown in FIG. 3B, a patterned mask (not shown) is formed on the third dielectric layer 308, and the pattern of the patterned mask is transferred to the semiconductor layer 302, the first dielectric layer 304, the second dielectric layer 306, and the third dielectric layer 308. In other words, an opening 310 is formed in the semiconductor layer 302, the first dielectric layer 304, the second dielectric layer 306, and the third dielectric layer 308. The opening 310 may be formed by one or more etch processes to remove portions of the semiconductor layer 302, the first dielectric layer 304, the second dielectric layer 306, and the third dielectric layer 308. In some embodiments, the opening 310 extends into the top dielectric layer 114 as a result of slight over etching of the semiconductor layer 302, as shown in FIG. 3B. The mask may be removed after the formation of the opening 310. Next, the sidewall spacer structure 134 is formed on the sidewalls of the semiconductor layer 302, the first dielectric layer 304, the second dielectric layer 306, and the third dielectric layer 308. In some embodiments, the sidewall spacer structure 134 is also formed on a sidewall of the top dielectric layer 114. The sidewall spacer structure 134 may be formed by first forming a blanket layer on the third dielectric layer 308, the sidewalls of the semiconductor layer 302, the first dielectric layer 304, the second dielectric layer 306, and the third dielectric layer 308, and the top dielectric layer 114. Then, an anisotropic etching is performed to remove portions of the blanket layer formed on horizontal surfaces. The top surface of the sidewall spacer structure 134 may be slanted as a result of the anisotropic etching. A portion of the top dielectric layer 114 is exposed at the bottom of the opening 310.

Figure 3C:
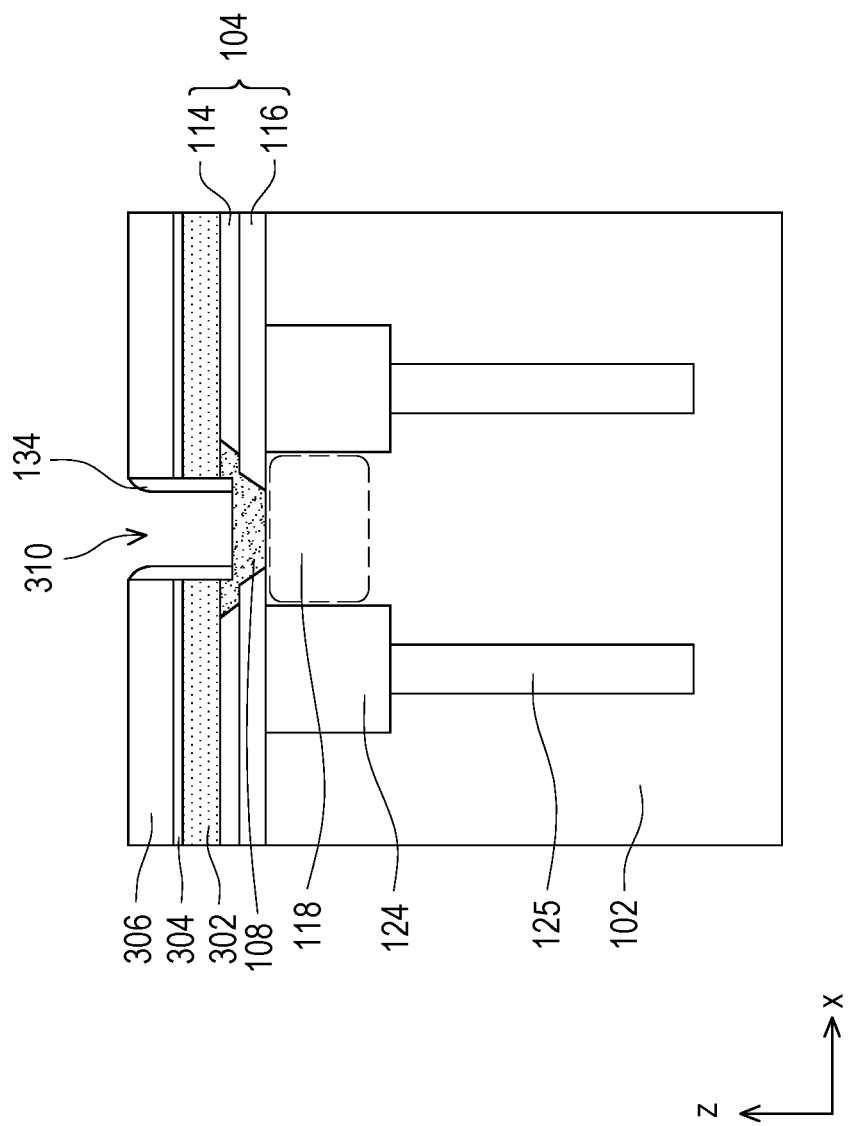

As shown in FIG. 3C, the lower base structure 108 is formed in the top and bottom dielectric layers 114, 116. After forming the opening 310, the exposed portion of the top dielectric layer 114 and a portion of the bottom dielectric layer 116 are removed by an etch process. In some embodiments, a single etch process is performed to remove the portions of the top and bottom dielectric layers 114, 116. The materials of the top and bottom dielectric layers 114, 116 may have an etch selectivity between about 3 to 1 and about 5 to 1, such as about 4 to 1. In other words, the top dielectric layer 114 is etched at a rate that is about 3 times to about 5 times faster than the rate the bottom dielectric layer 116 is etched at. The amount of the top dielectric layer 114 being removed forms the size of the first top surface 108t1 (FIG. 1B) or the dimension Tc (FIGS. 2A and 2B). Thus, if the etch selectivity between the top dielectric layer 114 and the bottom dielectric layer 116 is less than about 3, the first top surface 108t1 may be too small and hence a contact resistance between the lower base structure 108 and the upper base structure 110 may be high. On the other hand, if the etch selectivity between the top dielectric layer 114 and the bottom dielectric layer 116 is greater than about 5, the semiconductor layer 302 from which the upper base structure 110 is formed may collapse into the opening 310 within which the lower base structure 108 is formed. In some embodiments, a wet etch process is performed to remove the portions of the top and bottom dielectric layers 114, 116. The wet etch process may use hydrofluoric acid (HF) as an etchant, and the wet etch does not substantially affect the materials of the second dielectric layer 306, the sidewall spacer structure 134, and the collector region 118. The third dielectric layer 308 may be removed as a result of the wet etch process.

As described above, the sidewall spacer structure 134 does not include the same material as the top and bottom dielectric layers 114, 116. Otherwise, the sidewall spacer structure 134 may be removed by the process that removes portions of the top and bottom dielectric layers 114, 116.

Next, the lower base structure 108 is formed from the collector region 118 to fill the space in the top and bottom dielectric layers 114, 116. In some embodiments, the lower base structure 108 is formed by an epitaxy process. In some embodiments, in addition to the semiconductor precursors for forming the lower base structure 108, an etchant, such as chlorine-based etchant or fluorine-based etchant, is also used in the epitaxy process in order to form a substantially flat second top surface 108t2 (FIG. 1B) of the lower base structure 108. The epitaxial growth of the lower base structure 108 may result in faceted surfaces at a location not constrained by the surrounding materials, and the etchant is used to remove the facet, resulting in a substantially flat surface. In some embodiments, the second top surface 108t2 (FIG. 1B) may have a slight curvature, such as a concave or convex curvature.

Figure 3D:
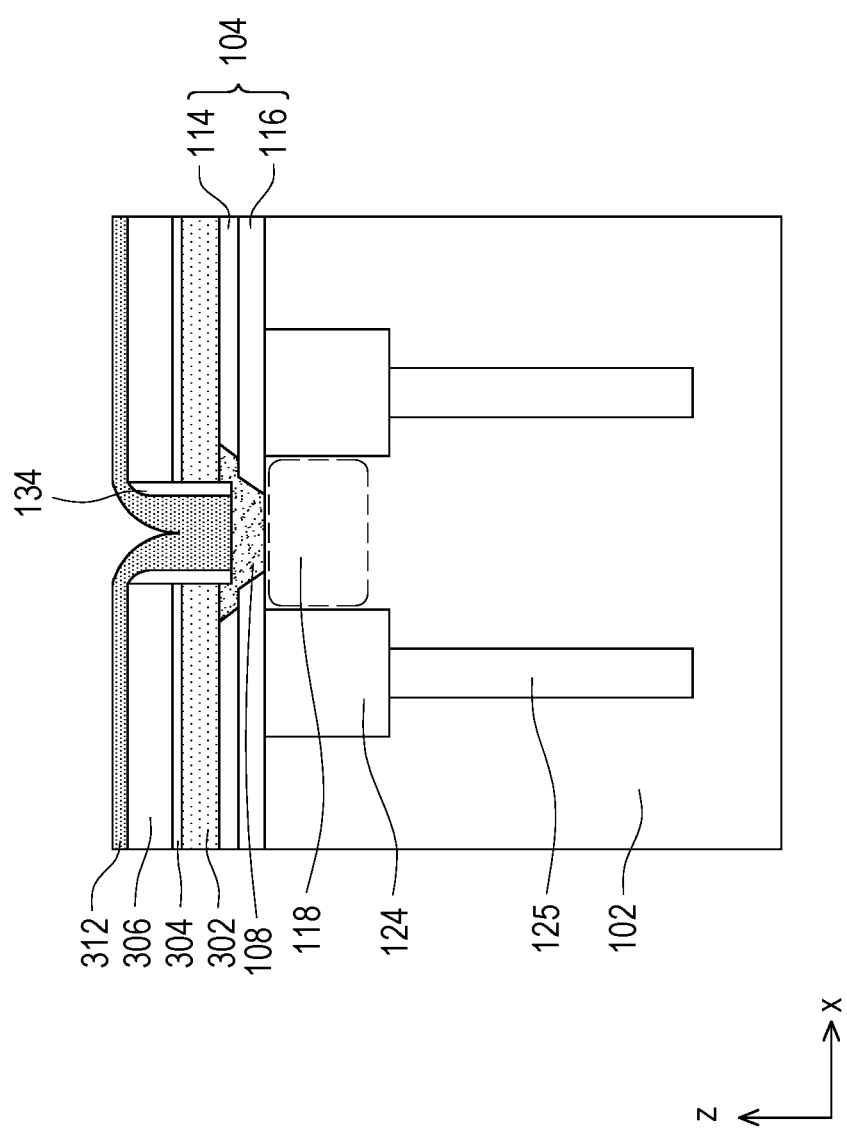
Figure 3E:
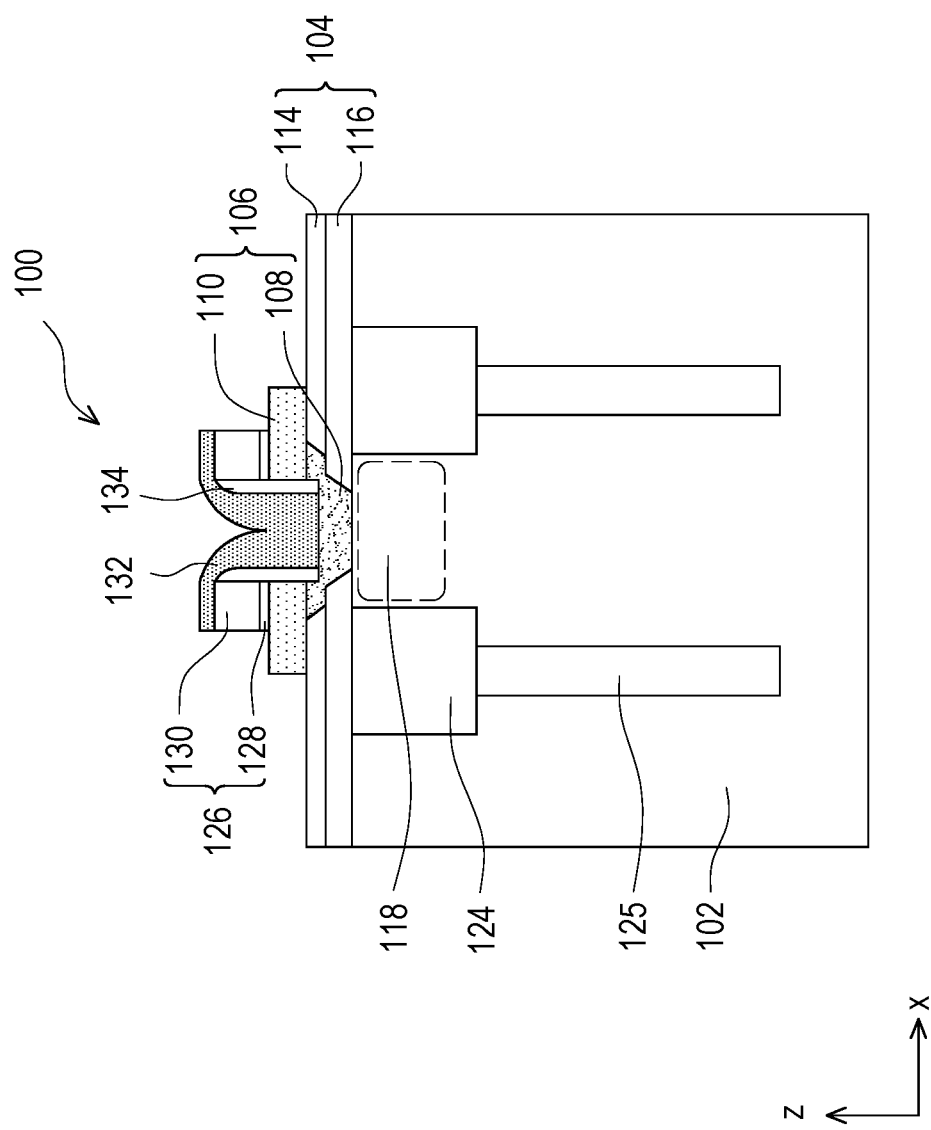

As shown in FIG. 3D, a semiconductor layer 312 is formed on the second dielectric layer 306 and in the opening 310. The semiconductor layer 312 may include the same material as the emitter region 132 and may be formed by any suitable process, such as CVD. Next, as shown in FIG. 3E, the semiconductor layer 312 is patterned to form the emitter region 132, the first and second dielectric layers 304, 306 are patterned to form the first and second hard mask layers 128, 130, respectively. The semiconductor layer 302 is patterned to form the upper base structure 110. In some embodiments, a first mask (not shown) is used to pattern the semiconductor layer 312 and the first and second dielectric layers 304, 306, and multiple etch processes are performed to remove portions of the semiconductor layer 312 and the first and second dielectric layers 304, 306 to form the emitter region 132 and the hard mask 126. A second mask (not shown) is used to pattern the semiconductor layer 302, and an etch process is performed to remove a portion of the semiconductor layer 302 to form the upper base structure 110.

Figure 4A:
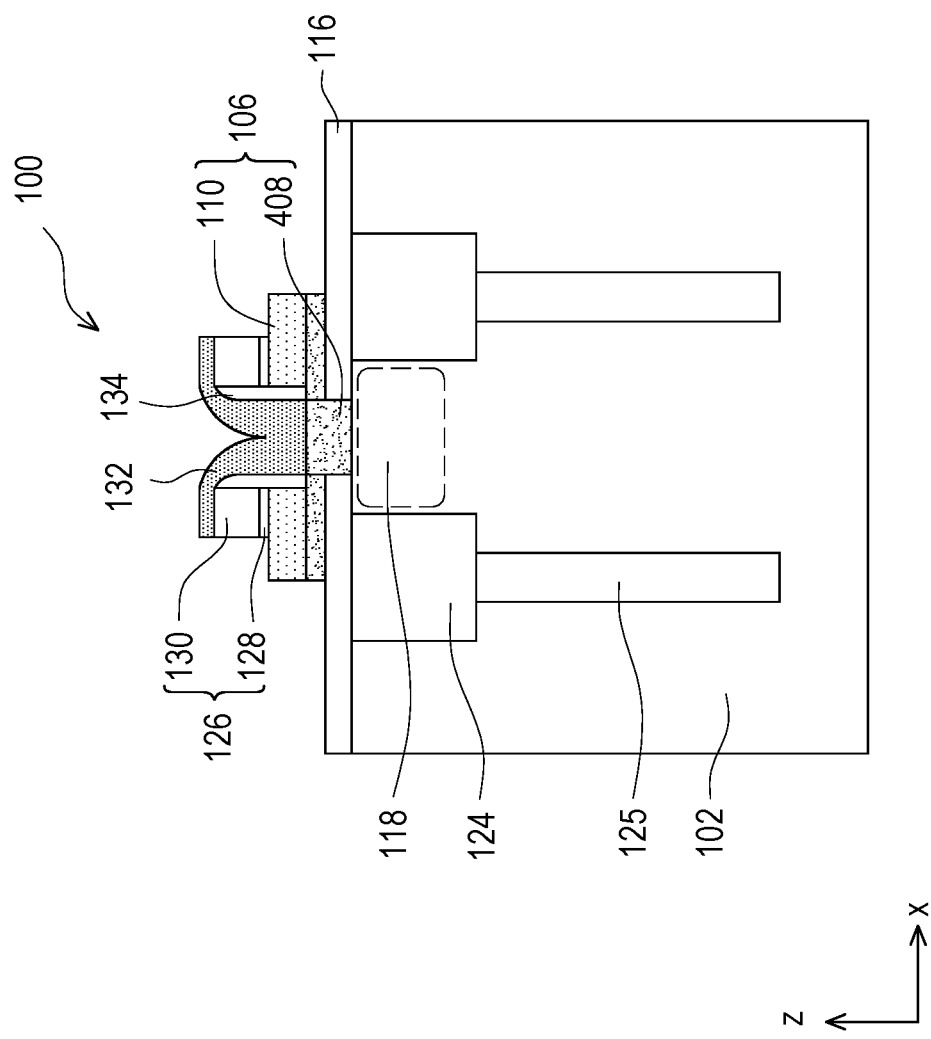
FIG. 4A is a cross-sectional side view of the bipolar junction transistor, in accordance with alternative embodiments.
Figure 4B:
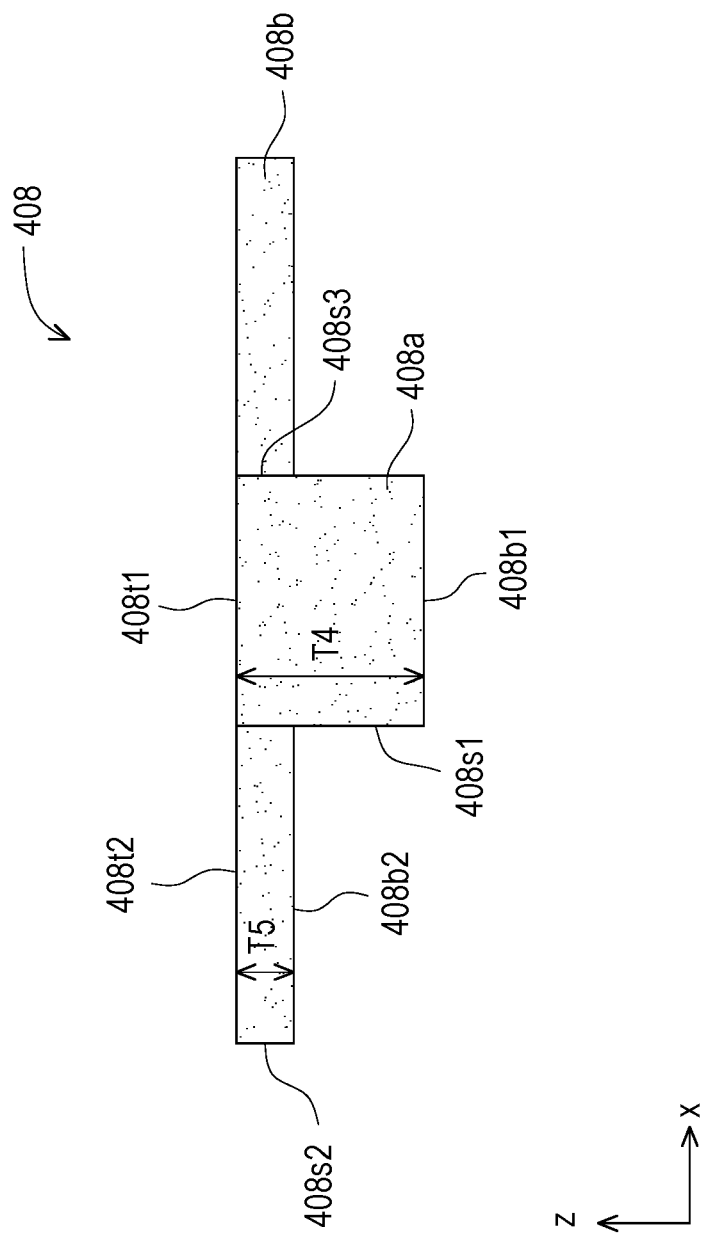
FIG. 4B is a cross-sectional side view of a lower base structure of the bipolar junction transistor of FIG. 4A, in accordance with some embodiments.

FIG. 4A is a cross-sectional side view of the BJT 100, in accordance with alternative embodiments. As shown in FIG. 4A, instead of having the lower base structure 108, the BJT 100 includes a lower base structure 408. The top dielectric layer 114 is not present in the BJT 100 shown in FIG. 4A. The lower base structure 408 includes the same material as the lower base structure 108. In some embodiments, the lower base structure includes doped silicon germanium. FIG. 4B is a cross-sectional side view of the lower base structure 408 of the BJT 100 of FIG. 4A, in accordance with some embodiments. As shown in FIGS. 4A and 4B, the lower base structure 408 includes a center portion 408a and an outer portion 408b. Unlike the bottom portion 108a and the top portion 108b of the lower base structure 108, which are a single piece of material, the center portion 408a and the outer portion 408b are two separate layers. Each of the center portion 408a and outer portion 408b includes the same material as the lower base structure 108. The center portion 408a and the outer portion 408b may be formed at different times, and the formation of the center portion 408a and the outer portion 408b is described in FIGS. 5A to 5D.

The center portion 408a includes a top surface 408t1, a bottom surface 408b1, and a side surface 408s1 connecting the top surface 408t1 and the bottom surface 408b1. The bottom surface 408b1 is disposed on the collector region 118, and the top surface 408t1 is in contact with the emitter region 132. The center portion 408a may have a cylindrical shape, a cubic shape, or other suitable shape. In some embodiments, the top surface 408t1 of the center portion 408a may be substantially flat as shown in FIG. 4B or substantially curved, such as having a concave or convex curvature. A bottom portion of the center portion 408a is surrounded by the bottom dielectric layer 116. For example, a bottom portion of the side surface 408s1 is in contact with the bottom dielectric layer 116. The center portion 408a has a thickness T4 ranging from about 30 nm to about 40 nm.

The outer portion 408b includes a top surface 408t2, a bottom surface 408b2, an outer surface 408s2, and an inner surface 408s3. The bottom surface 408b2 is disposed on the bottom dielectric layer 116, and the outer surface 408s2 is substantially aligned with an outer surface of the upper base structure 110. The top surface 408t2 is in contact with the upper base structure 110 and the sidewall spacer structure 134. In some embodiments, the entire bottom surface of the upper base structure 110 is in contact with the top surface 408t2. Thus, the contact area between the lower base structure 408 and the upper base structure 110 is maximized. In some embodiments, the top surface 408t2 is substantially coplanar with the top surface 408t1 of the center portion 408a, as shown in FIG. 4B. The inner surface 408s3 surrounds a top portion of the center portion 408a. For example, the inner surface 408s3 is in contact with a top portion of the side surface 408s1 of the center portion 408a. The outer portion 408b may have an annular shape, a square ring shape, or other suitable shape. The outer portion 408b has a thickness T5 ranging from about 10 nm to about 20 nm.

Figure 5A:
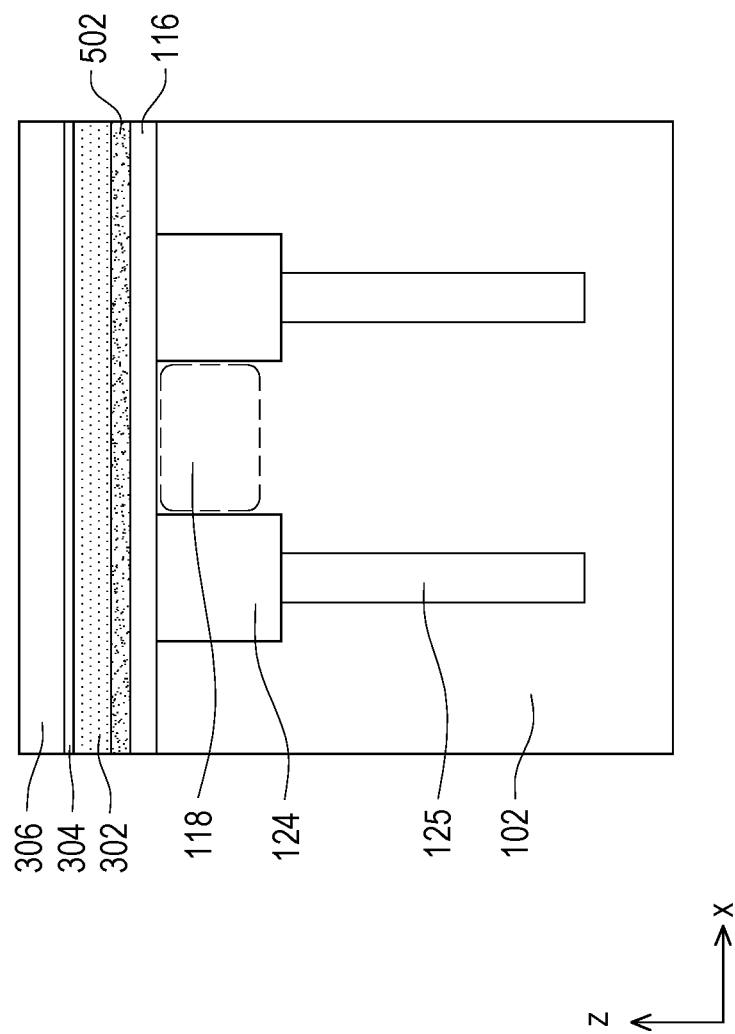
FIGS. 5A-5D are cross-sectional side views of various stages of manufacturing the bipolar junction transistor of FIG. 4A, in accordance with some embodiments.

FIGS. 5A-5D are cross-sectional side views of various stages of manufacturing the BJT 100 of FIG. 4A, in accordance with some embodiments. As shown in FIG. 5A, the collector region 118 and the isolation regions 124, 125 are formed in the substrate 102, and the bottom dielectric layer 116 is formed on the substrate 102. A semiconductor layer 502 is formed on the bottom dielectric layer 116. The outer portion 408b of the lower base structure 408 is formed from the semiconductor layer 502. In some embodiments, the outer portion 408b of the lower base structure 408 includes doped crystalline silicon germanium, and the semiconductor layer 502 is a doped crystalline silicon germanium layer. The semiconductor layer 502 may be formed by first depositing an amorphous silicon germanium layer on the bottom dielectric layer 116 and followed by crystallizing the amorphous silicon germanium layer to form a crystalline silicon germanium layer. The doping of the semiconductor layer 502 may be performed in-situ or ex-situ.

The semiconductor layer 302 is formed on the semiconductor layer 502, the first dielectric layer 304 is formed on the semiconductor layer 302, and the second dielectric layer 306 is formed on the first dielectric layer 304. In some embodiments, the third dielectric layer 308 is not present.

Figure 5B:
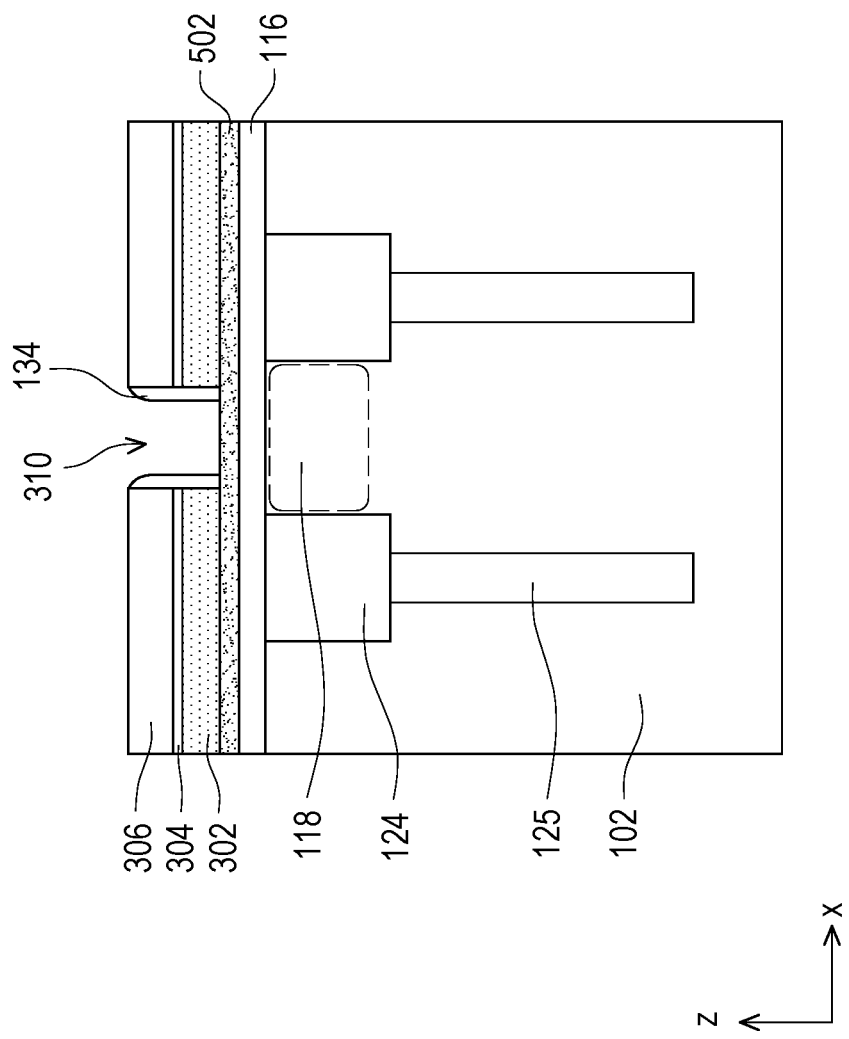

As shown in FIG. 5B, the patterned mask (not shown) is formed on the second dielectric layer 306, and the pattern of the patterned mask is transferred to the semiconductor layer 302, the first dielectric layer 304, and the second dielectric layer 306. In other words, the opening 310 is formed in the semiconductor layer 302, the first dielectric layer 304, and the second dielectric layer 306. In some embodiments, the opening 310 extends into the semiconductor layer 502 as a result of slight over etching of the semiconductor layer 302. The mask may be removed after the formation of the opening 310. Next, the sidewall spacer structure 134 is formed on the semiconductor layer 502 and on the sidewalls of the semiconductor layer 302, the first dielectric layer 304, and the second dielectric layer 306. In some embodiments, the sidewall spacer structure 134 is also formed on a sidewall of the semiconductor layer 502. The sidewall spacer structure 134 may be formed by first forming a blanket layer on the second dielectric layer 306, the sidewalls of the semiconductor layer 302, the first dielectric layer 304, and the second dielectric layer 306, and the semiconductor layer 502. Then, an anisotropic etching is performed to remove portions of the blanket layer formed on horizontal surfaces. The top surface of the sidewall spacer structure 134 may be slanted as a result of the anisotropic etching. A portion of the semiconductor layer 502 is exposed at the bottom of the opening 310.

Figure 5C:
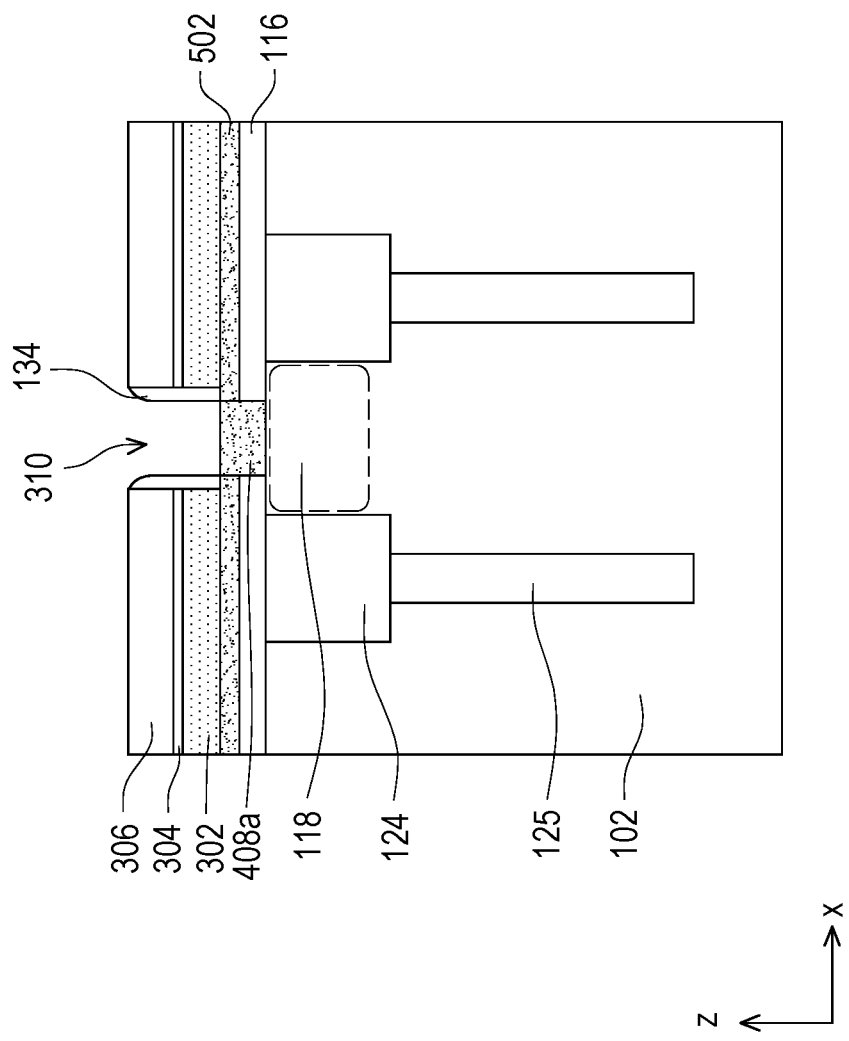

As shown in FIG. 5C, the center portion 408a of the lower base structure 408 is formed in the bottom dielectric layer 116 and the semiconductor layer 502. After forming the opening 310, the exposed portion of the semiconductor layer 502 and a portion of the bottom dielectric layer 116 are removed by one or more etch processes. The one or more etch processes may be selective, so the second dielectric layer 306 and the sidewall spacer structure 134 are not substantially affected. Next, the center portion 408a of the lower base structure 408 is formed from the collector region 118 to fill the space in the semiconductor layer 502 and the bottom dielectric layer 116. In some embodiments, the center portion 408a of the lower base structure 408 is formed by an epitaxy process. In some embodiments, in addition to the semiconductor precursors for forming the center portion 408a of the lower base structure 408, an etchant, such as chlorine-based etchant or fluorine-based etchant, is also used in the epitaxy process in order to form a substantially flat top surface 408t1 (FIG. 4B) of the lower base structure 408. The epitaxial growth of the center portion 408a of the lower base structure 408 may result in faceted surfaces at a location not constrained by the surrounding materials, and the etchant is used to remove the facet, resulting in a substantially flat surface.

Figure 5D:
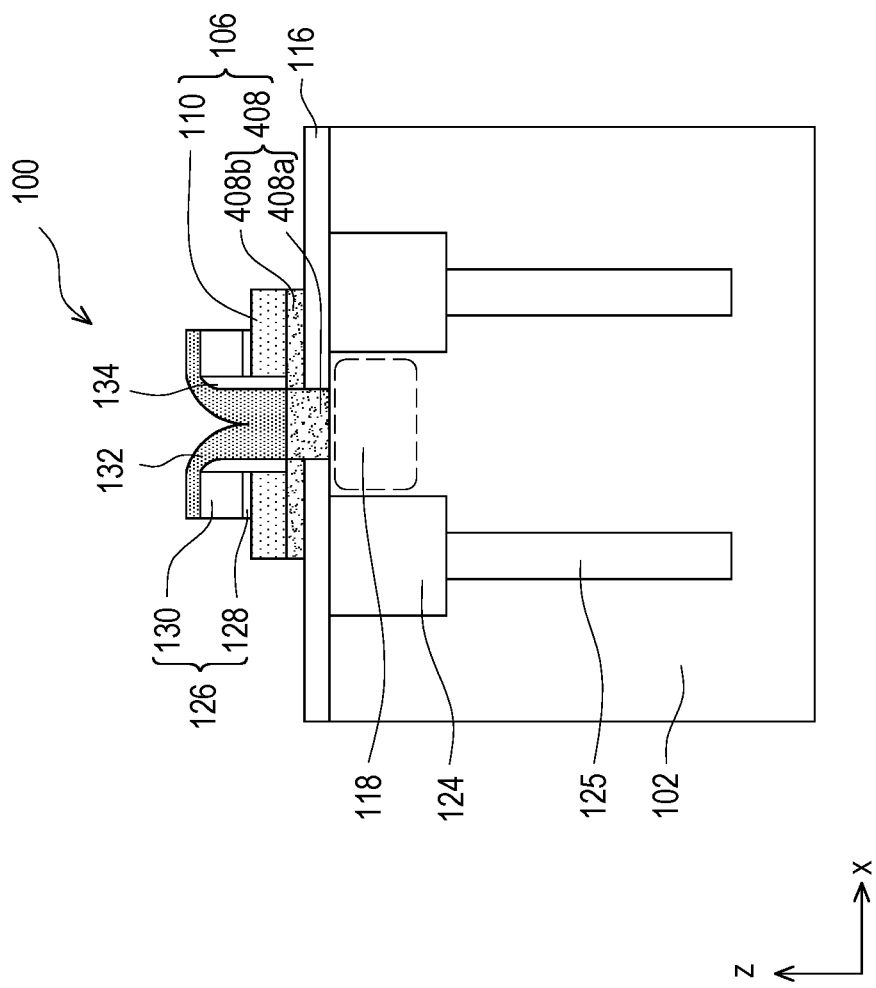

As shown in FIG. 5D, the emitter region 132 is formed in the opening 310, the first and second dielectric layers 304, 306 are patterned to form the first and second hard mask layers 128, 130, respectively, and the semiconductor layer 302 and the semiconductor layer 502 are patterned to form the upper base structure 110 and the outer portion 408b of the lower base structure 408, respectively. In some embodiments, a first mask (not shown) is used to pattern the semiconductor layer 312 and the first and second dielectric layers 304, 306, and multiple etch processes are performed to remove portions of the semiconductor layer 312 and the first and second dielectric layers 304, 306 to form the emitter region 132 and the hard mask 126. A second mask (not shown) is used to pattern the semiconductor layer 302 and the semiconductor layer 502, and one or more etch processes are performed to remove portions of the semiconductor layers 302, 502 to form the upper base structure 110 and the outer portion 408b of the lower base structure 408, respectively. The resulting BJT 100 shown in FIG. 5D includes maximized contact area between the lower base structure 408 and the upper base structure 110. After forming the BJT 100 as shown in FIG. 3E or FIG. 5D, subsequent processes, such as forming a dielectric material to embed the BJT 100 and forming an interconnect structure on the dielectric material.

The present disclosure provides a BJT 100 having an increased contact area between a lower base structure 108 (or 408) and the upper base structure 110. Some embodiments may achieve advantages. For example, because the contact area is large, the contact resistance between the lower and upper base structures 108 (or 408), 110 (e.g., a resistance at the contact area) may be small. As such, an overall resistance of the base region 106 may be small. Because the resistance of the base region 106 may be small, current through the BJT 100 may be large and hence the transit time of the BJT 100 may be small.

An embodiment is a BJT. The BJT includes a collector region disposed in a substrate, a lower base structure disposed on the collector region, and a first dielectric layer surrounding a bottom portion of the lower base structure. The first dielectric layer includes a first oxide. The BJT further includes a second dielectric layer surrounding a top portion of the lower base structure, and the second dielectric layer includes a second oxide. The first and second oxides have different densities. The BJT further includes an upper base structure disposed on the second dielectric layer and the lower base structure and an emitter region disposed on the lower base structure. The upper base structure surrounds the emitter region. The BJT further includes a sidewall spacer structure disposed between the emitter region and the upper base structure, and the sidewall spacer structure includes a material different from materials of the first and second dielectric layers.

Another embodiment is a BJT. The BJT includes a collector region disposed in a substrate and a lower base structure disposed on the collector region. The lower base structure includes a center portion and an outer portion surrounding the center portion, and the outer portion includes an outer surface. The BJT further includes an upper base structure disposed on the outer portion of the lower base structure, and the upper base structure includes an outer surface substantially aligned with the outer surface of the outer portion of the lower base structure. The BJT further includes an emitter region disposed on the lower base structure, and the upper base structure surrounds the emitter region.

A further embodiment is a method. The method includes depositing a first oxide layer by a first process over a substrate, depositing a second oxide layer on the first oxide layer by a second process different from the first process, depositing a semiconductor layer on the second oxide layer, forming a hard mask on the semiconductor layer, forming an opening in the hard mask and the semiconductor layer to expose a portion of the second oxide layer, removing the exposed portion of the second oxide layer and a portion of the first oxide layer by an etch process, and depositing a lower base structure in the first and second oxide layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
depositing a first dielectric layer over a substrate;
depositing a first semiconductor layer on the first dielectric layer;

depositing a second semiconductor layer on the first semiconductor layer, wherein the first and second semiconductor layers comprise different materials;

depositing a second dielectric layer on the second semiconductor layer;

depositing a third dielectric layer on the second dielectric layer;

forming an opening in the first semiconductor layer, the second semiconductor layer, the first dielectric layer, the second dielectric layer, and the third dielectric layer to expose a portion of the substrate; and forming a center portion of a lower base structure from the exposed portion of the substrate.

2. The method of claim 1, further comprising forming an outer portion of the lower base structure by removing portions of the first semiconductor layer, wherein a remaining portion of the first semiconductor layer is the outer portion of the lower base structure.

3. The method of claim 2, wherein the outer portion of the lower base structure is in contact with the center portion of the lower base structure.

4. The method of claim 1, further comprising forming a sidewall spacer structure on the first semiconductor layer and on sidewalls of the second semiconductor layer, the second dielectric layer, and the third dielectric layer prior to forming the opening in the first semiconductor layer and the first dielectric layer and after forming the opening in the second semiconductor layer, the second dielectric layer, and the third dielectric layer.

5. The method of claim 4, wherein forming the sidewall spacer structure comprises:

depositing a blanket layer on the third dielectric layer and the first semiconductor layer and on the sidewalls of the second semiconductor layer, the second dielectric layer, and the third dielectric layer; and performing an anisotropic process to remove portions of the blanket layer formed on horizontal surfaces.

6. The method of claim 5, wherein a top surface of the sidewall spacer structure is slanted.

7. The method of claim 1, wherein the center portion of the lower base structure is formed by an epitaxy process.

8. The method of claim 7, wherein the epitaxy process comprises using a semiconductor precursor and an etchant to form a substantially flat top surface of the center portion of the lower base structure.

9. The method of claim 2, further comprising forming an upper base structure by removing portions of the second semiconductor layer, wherein a remaining portion of the second semiconductor layer is the upper base structure.

10. The method of claim 9, further comprising forming an emitter region in the opening, wherein the emitter region is in contact with the center portion of the lower base structure.

11. The method of claim 1, wherein the center portion of the lower base structure is formed over a collector region in the substrate.

12. The method of claim 11, wherein the collector region is surrounded by an isolation region.

13. A method, comprising:

depositing a first dielectric layer over a substrate;

depositing a first semiconductor layer on the first dielectric layer;

depositing a second semiconductor layer on the first semiconductor layer;

depositing a second dielectric layer on the second semiconductor layer;

forming an opening in the second semiconductor layer and the second dielectric layer;

forming a sidewall spacer structure on the first semiconductor layer and on sidewalls of the second semiconductor layer and the second dielectric layer;

removing a portion of the first semiconductor layer and a portion of the first dielectric layer to expose a portion of the substrate; and forming a semiconductor material from the exposed portion of the substrate.

14. The method of claim 13, wherein the first semiconductor layer has a first top surface, and the semiconductor material has a second top surface substantially coplanar with the first top surface.

15. The method of claim 13, wherein the semiconductor material has a cylindrical shape.

16. The method of claim 13, further comprising forming a doped semiconductor material on the semiconductor material.

17. The method of claim 16, further comprising removing portions of the first semiconductor layer, the second semiconductor layer, and the second dielectric layer.

18. The method of claim 17, wherein an outer surface of the first semiconductor layer is aligned with an outer surface of the second semiconductor layer.

19. A method, comprising:

forming a collector region in a substrate;

depositing a first dielectric layer on the substrate;

forming a lower base structure of a base region over the substrate, wherein the lower base structure comprises a center portion and an outer portion, wherein the center portion and the outer portion are formed at different times;

forming an upper base structure of the base region, wherein the upper base structure is disposed on the outer portion of the lower base structure; and forming an emitter region on the center portion of the lower base structure of the base region.

20. The method of claim 19, further comprising forming a sidewall spacer structure, wherein the sidewall spacer structure separates the emitter region from the upper base structure.

* * * * *